(12) United States Patent
Kono et al.

(10) Patent No.: US 8,582,009 B2
(45) Date of Patent: Nov. 12, 2013

(54) SOLID-STATE IMAGE SENSOR AND IMAGE SENSING APPARATUS

(75) Inventors: Shoji Kono, Hachioji (JP); Nobuhiro Takeda, Yokohama (JP); Yuichiro Yamashita, Ebina (JP); Takashi Matsuda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 104 days.

(21) Appl. No.: 12/882,276

(22) Filed: Sep. 15, 2010

(65) Prior Publication Data

US 2011/0080493 A1    Apr. 7, 2011

(30) Foreign Application Priority Data

Oct. 6, 2009    (JP) .................... 2009-232866

(51) Int. Cl.
*H04N 3/14*    (2006.01)

(52) U.S. Cl.
USPC ........... 348/302; 348/281; 348/308; 348/300; 348/294

(58) Field of Classification Search
USPC .............................................. 348/294, 230.1
See application file for complete search history.

(56) References Cited

U.S. PATENT DOCUMENTS

| | | | |
|---|---|---|---|
| 5,237,185 A | 8/1993 | Udagawa et al. | 257/204 |
| 6,992,714 B1 | 1/2006 | Hashimoto et al. | 348/273 |
| 7,294,818 B2 | 11/2007 | Matsuda et al. | 250/208.1 |
| 7,623,056 B2 | 11/2009 | Yamashita | 341/163 |
| 7,633,539 B2 | 12/2009 | Yamashita | 348/294 |
| 7,705,900 B2 * | 4/2010 | Guidash | 348/308 |
| 7,817,199 B2 | 10/2010 | Yamashita et al. | 348/308 |
| 8,023,025 B2 * | 9/2011 | Itano et al. | 348/308 |
| 2001/0010554 A1 * | 8/2001 | Yoshida | 348/312 |
| 2005/0128327 A1 * | 6/2005 | Bencuya et al. | 348/308 |
| 2005/0189472 A1 | 9/2005 | Asaba | 250/208.1 |
| 2006/0133458 A1 | 6/2006 | Ueno | 375/148 |
| 2006/0256221 A1 * | 11/2006 | Mckee et al. | 348/308 |
| 2007/0158713 A1 * | 7/2007 | Ohkawa | 257/292 |
| 2007/0257185 A1 | 11/2007 | Asaba | 250/208.1 |
| 2009/0244328 A1 | 10/2009 | Yamashita | 348/241 |
| 2009/0256176 A1 | 10/2009 | Kobayashi et al. | 257/225 |
| 2009/0284632 A1 | 11/2009 | Onuki et al. | 348/302 |
| 2009/0310001 A1 * | 12/2009 | Masuyama et al. | 348/300 |
| 2009/0322917 A1 * | 12/2009 | Kyogoku et al. | 348/273 |
| 2010/0020206 A1 | 1/2010 | Takeda | 348/241 |

(Continued)

FOREIGN PATENT DOCUMENTS

JP    2005-244995 A    9/2005
WO    WO 2008/075874 A1    6/2008

*Primary Examiner* — James M Hannett
*Assistant Examiner* — Wesley J Chiu
(74) *Attorney, Agent, or Firm* — Fitzpatrick, Cella, Harper & Scinto (57) ABSTRACT

In a solid-state image sensor, first and second column readout lines are provided to each pixel column, pixel rows are divided into pixel rows of first and second groups, the first group is divided into subgroups each formed from pixels of an identical color, the second group is divided into subgroups each formed from pixels of an identical color, signals from pixels of the pixel rows of the first group are output to the first column readout lines, and signals from pixels of the pixel rows of the second group are output to the second column readout lines. Pixels of an identical subgroup in an identical pixel column share a conversion region and an amplification element, a given conversion region and another conversion region included in a pixel column identical to a pixel column of the given conversion region do not intersect with each other.

17 Claims, 10 Drawing Sheets

(56) References Cited

U.S. PATENT DOCUMENTS

| | | | |
|---|---|---|---|
| 2010/0053396 A1 | 3/2010 | Okita et al. | 348/301 |
| 2010/0053398 A1 | 3/2010 | Yamashita | 348/302 |
| 2010/0066877 A1* | 3/2010 | Yamaguchi et al. | 348/279 |
| 2010/0165167 A1 | 7/2010 | Sugiyama et al. | 348/311 |
| 2010/0194946 A1* | 8/2010 | Shinohara et al. | 348/300 |
| 2010/0200738 A1 | 8/2010 | Yamashita | 250/227.11 |
| 2010/0225793 A1 | 9/2010 | Matsuda et al. | 348/280 |
| 2010/0271523 A1* | 10/2010 | Hara | 348/302 |
| 2011/0019043 A1* | 1/2011 | Hamada | 348/294 |
| 2011/0273598 A1* | 11/2011 | Ogino et al. | 348/272 |

\* cited by examiner

SOLID-STATE IMAGE SENSOR AND IMAGE SENSING APPARATUS

BACKGROUND OF THE INVENTION

1. Field of the Invention

The present invention relates to a solid-state image sensor, and an image sensing apparatus including the same.

2. Description of the Related Art

In recent years, a solid-state image sensor built into a digital camera must have a function which can sense not only a still image but also a moving image. While the number of pixels of a still image increases each generation, the number of pixels of a moving image is 1,920 in the horizontal direction and 1,080 in the vertical direction at present even if the moving image has a highest resolution. This means that a still image has a number of pixels far greater than a moving image. Hence, it is a common practice to select different numbers of pixels to be processed between still image sensing and moving image sensing. More specifically, it is a common practice in moving image sensing to add or average outputs from a plurality of pixels and use the sum or the average as an output from one pixel.

Japanese Patent Laid-Open No. 2005-244995 proposes a method of sharing a common floating diffusion (FD) between two or more pixels, which output identical color signals, among pixels of three colors: R, G, and B, and adding signals from the plurality of pixels by the FD.

In the color arrangement of, for example, a primary color filter or a complementary color filter, pixels of the same color are arranged every other pixel in the row and column directions. Therefore, when a common FD is shared using the method described in Japanese Patent Laid-Open No. 2005-244995, a wiring pattern for one color for use in sharing intersects with an adjacent wiring pattern for another color. This intersection causes outputs from pixels of different colors to capacitively couple with each other, thus leading to crosstalk. The crosstalk increases noise, so the signal-to-noise ratio (S/N) decreases.

SUMMARY OF THE INVENTION

The present invention provides a solid-state image sensor having an arrangement advantageous for reducing crosstalk.

One of aspects of the present invention provides a solid-state image sensor including a pixel array in which a plurality of pixels are two-dimensionally arranged so as to form a plurality of pixel rows and a plurality of pixel columns, and color filters arranged on the pixel array such that signals of colors corresponding to a color arrangement of the color filters are output from the plurality of pixels, wherein a first column readout line and a second column readout line are provided to each pixel column, the plurality of pixel rows which form the pixel array are divided into pixel rows of a first group and pixel rows of a second group, the first group is divided into a plurality of subgroups each of which is formed from pixels of an identical color, the second group is divided into a plurality of subgroups each of which is formed from pixels of an identical color, signals from pixels belonging to the pixel rows of the first group are output to the first column readout lines, and signals from pixels belonging to the pixel rows of the second group are output to the second column readout lines, each pixel includes a photoelectric conversion element and a transfer element, and a plurality of pixels belonging to an identical subgroup in an identical pixel column share a conversion region and an amplification element, charges generated in the photoelectric conversion elements are transferred to the conversion region by the transfer elements, the transferred charges are converted into a voltage in the conversion region, the voltage is amplified by the amplification element, and a given conversion region and another conversion region which is included in a pixel column identical to a pixel column of the given conversion region do not intersect with each other.

Further features of the present invention will become apparent from the following description of exemplary embodiments with reference to the attached drawings.

DESCRIPTION OF THE EMBODIMENTS

Embodiments of the present invention will be described below with reference to the accompanying drawings.

Figure 6:
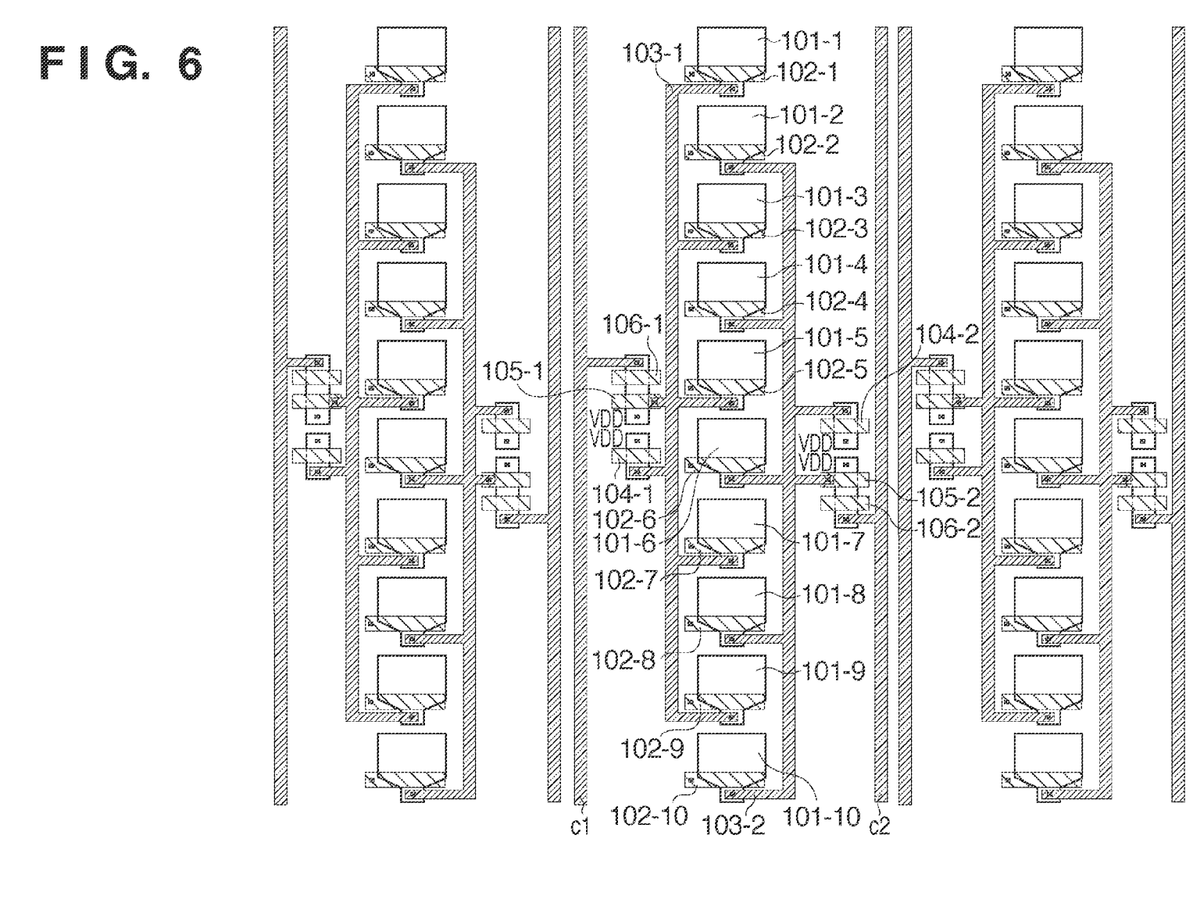
FIG. 6 is a plan layout diagram showing the third embodiment of the present invention.
Figure 9:
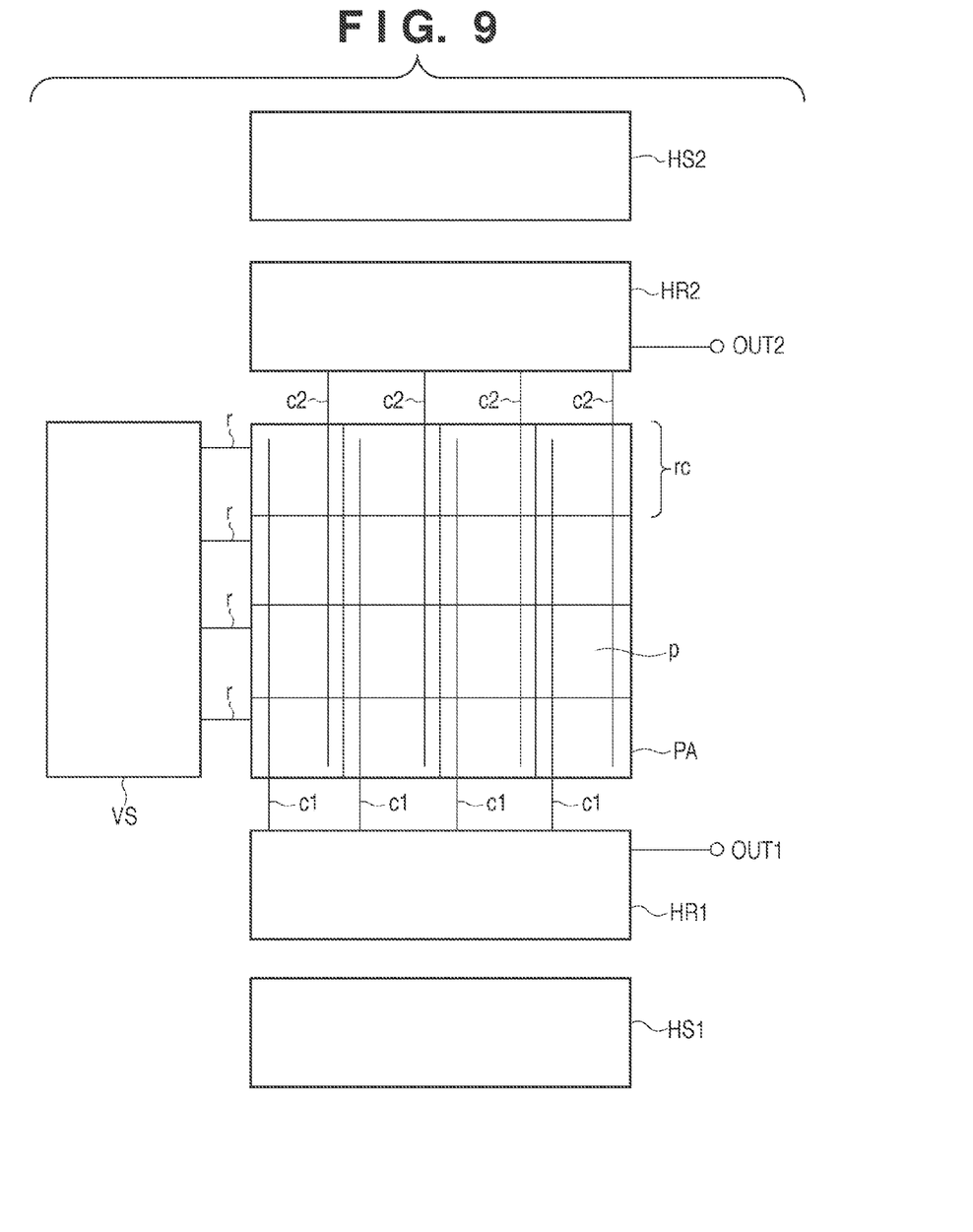
FIG. 9 is a block diagram showing the schematic arrangement of a solid-state image sensor according to an embodiment of the present invention.

FIG. 9 is a block diagram showing the schematic arrangement of a solid-state image sensor IS according to an embodiment of the present invention. The solid-state image sensor IS is designed as an active pixel image sensor such as a CMOS image sensor. An active pixel image sensor is a solid-state image sensor in which each pixel includes a photoelectric conversion element and an amplification element which amplifies a signal obtained by photoelectric conversion by the photoelectric conversion element. In this embodiment, the amplification element is shared by a plurality of pixels. The solid-state image sensor IS includes a pixel array PA, vertical selection circuit VS, first readout circuit HR1, second readout circuit HR2, first horizontal selection circuit HS1, and second horizontal selection circuit HS2. The pixel array PA includes a plurality of pixels p which are two-dimensionally arranged so as to form a plurality of pixel rows pr and a plurality of pixel columns pc. FIG. 6 illustrates a pixel array simplified for the sake of descriptive convenience as the pixel array PA. Each pixel column pc in the pixel array PA includes two column readout lines: a first column readout line c1 and a second column readout line c2.

The plurality of pixel rows pr which form the pixel array PA are divided into pixel rows of a first group and those of a second group. For example, the first group can include odd rows (odd-numbered rows), and the second group can include even rows (even-numbered rows). Alternatively, the first group can include even rows, and the second group can include odd rows. The first column readout lines c1 can be used to read signals from pixels in even rows, and the second column readout lines c2 can be used to read signals from pixels in odd rows. Alternatively, the first column readout lines c1 may be used to read signals from pixels in odd rows, and the second column readout lines c2 may be used to read signals from pixels in even rows. Or again, an arbitrary half of the plurality of pixel rows pr which form the pixel array PA can be classified as a first group, and the remaining half can be classified as a second group.

The vertical selection circuit VS selects one pixel row belonging to the first group in the pixel array PA, and one pixel row belonging to the second group in the pixel array PA at different timings or simultaneously. The first readout circuit HR1 reads a signal via the first column readout line c1 from a pixel belonging to one of two simultaneously selected pixel rows pr in the pixel array PA, and outputs it to a first output terminal OUT1. The second readout circuit HR2 reads a signal via the second column readout line c2 from a pixel belonging to the other one of the two simultaneously selected pixel rows pr in the pixel array PA, and outputs it to a second output terminal OUT2. The first readout circuit HR1 and second readout circuit HR2 are preferably arranged to sandwich the pixel array PA between them. The first horizontal selection circuit HS1 selects a pixel column pc to be read in the pixel array PA. The second horizontal selection circuit HS2 also selects a pixel column pc to be read in the pixel array PA. Note that although the pixel array PA includes four pixel rows and two pixel columns for the sake of descriptive simplicity in FIG. 9, it typically can include larger numbers of pixel rows and pixel columns.

Figure 1:
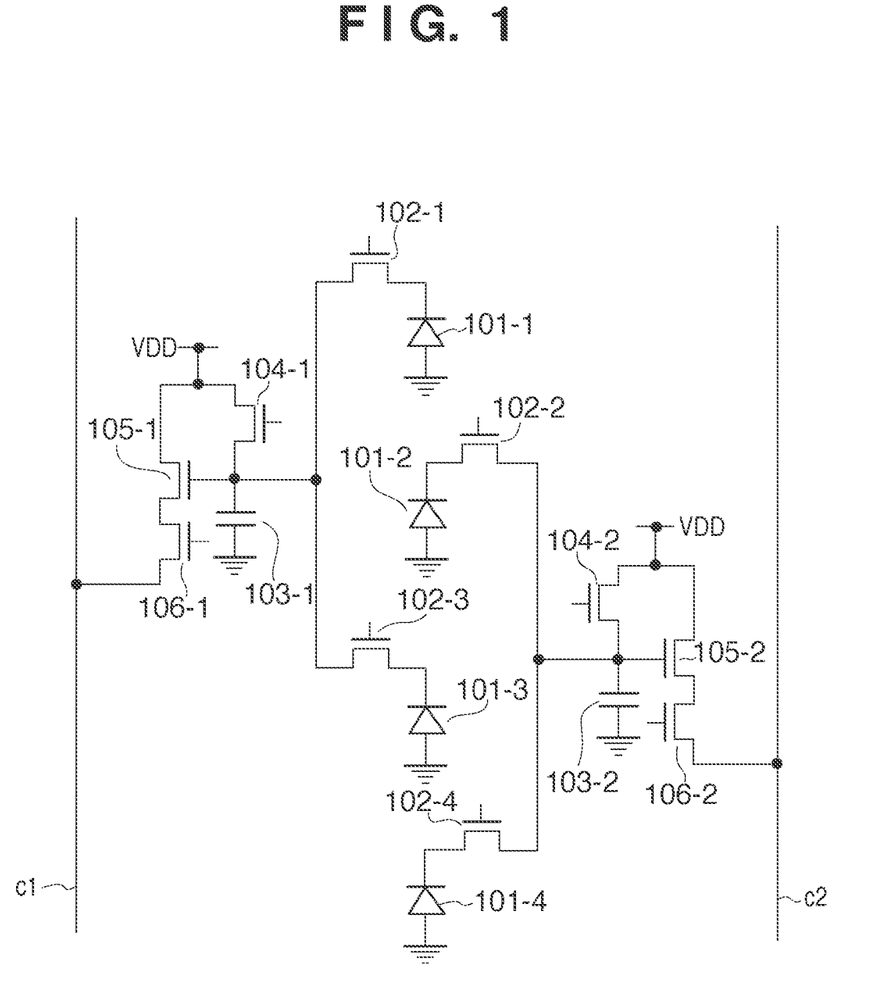
FIG. 1 is a circuit diagram exemplifying the partial circuitry of one pixel column in a pixel array.

FIG. 1 is a circuit diagram exemplifying the partial circuitry of one pixel column pc in the pixel array PA in the first embodiment of the present invention. Note that FIG. 1 shows pixels in only four rows for the sake of simplicity. Each pixel includes a photodiode 101 (the photodiode 101 typifies photodiodes 101-1, 101-2, 101-3, and 101-4), and a transfer transistor 102 (the transfer transistor 102 typifies transfer transistors 102-1, 102-2, 102-3, and 102-4). More specifically, the pixel in the first pixel row and the first pixel column includes the photodiode 101-1 and transfer transistor 102-1. The pixel in the second pixel row and the first pixel column includes the photodiode 101-2 and transfer transistor 102-2. The pixel in the third pixel row and the first pixel column includes the photodiode 101-3 and transfer transistor 102-3. The pixel in the fourth pixel row and the first pixel column includes the photodiode 101-4 and transfer transistor 102-4. In the first embodiment shown in FIG. 1, a plurality of (two in this case) pixels in the same pixel column share a conversion region 103 (the conversion region 103 typifies conversion regions 103-1 and 103-2) which converts charges into a voltage, a reset transistor 104 (the reset transistor 104 typifies reset transistors 104-1 and 104-2), an amplification transistor 105 (the amplification transistor 105 typifies amplification transistors 105-1 and 105-2), and a selection transistor 106 (the selection transistor 106 typifies selection transistors 106-1 and 106-2). More specifically, the pixels in the same pixel column and the first and third pixel rows, respectively, share the conversion region 103-1, reset transistor 104-1, amplification transistor 105-1, and selection transistor 106-1. Also, the pixels in the same pixel column and the second and fourth pixel rows, respectively, share the conversion region 103-2, reset transistor 104-2, amplification transistor 105-2, and selection transistor 106-2.

Color filters corresponding to a predetermined color arrangement are arranged on the pixel array PA. Although an example in which color filters corresponding to a Bayer arrangement are arranged on the pixel array PA will be explained herein, the present invention is also applicable when color filters corresponding to another color arrangement (e.g., the color arrangement of a complementary color filter) are arranged on the pixel array PA. If the color filters used correspond to a Bayer arrangement, G (Green) color filters are arranged on the photodiodes 101-1 and 101-3 in the pixels of the first pixel column and the first and third pixel rows, respectively. Also, R color filters are arranged on the photodiodes 101-2 and 101-4 in the pixels of the first pixel column and the second and fourth pixel rows, respectively. Thus, the pixels of the same color (G color) in the first and third pixel rows, respectively, share the conversion region 103-1, reset transistor 104-1, amplification transistor 105-1, and selection transistor 106-1, and output signals to a first column readout line 107-1. Also, the pixels of the same color (R color) in the second and fourth pixel rows, respectively, share the conversion region 103-2, reset transistor 104-2, amplification transistor 105-2, and selection transistor 106-2, and output signals to a second column readout line 107-2.

Assume herein that a set of pixels of the same color, that share the conversion region 103 which converts charges into a voltage, are classified as a subgroup. The plurality of pixel rows pr which form the pixel array PA are divided into pixel rows of the first group in which signals are output to one of the first column readout lines and the second column readout lines, and those of the second group in which signals are output to the other one, as described earlier. The first group is further divided into a plurality of subgroups each of which is formed from pixels of the same color, and the second group is further divided into a plurality of subgroups each of which is formed from pixels of the same color.

The photodiode 101 (which typifies the photodiodes 101-1, 101-2, 101-3, and 101-4) exemplifies a photoelectric conversion element. The conversion region 103 (which typifies the conversion regions 103-1 and 103-2) is a capacitance element which holds charges output from the photodiodes 101 and converts them into a voltage. The conversion region 103 typically includes a floating diffusion (diffusion region) formed on a semiconductor substrate, and an electrically conductive member connected to it. The electrically conductive member can include an electrically conductive member pattern formed in a wiring layer, and a plug (contact plug or via plug) which connects the diffusion region and the electrically conductive member pattern to each other. The amplification transistor 105 (which typifies the amplification transistors 105-1 and 105-2) exemplifies an amplification element which amplifies the voltage of the conversion region 103. The reset transistor 104 (which typifies the reset transistors 104-1 and 104-2) exemplifies a reset element which resets (initializes) the voltage of the conversion region 103, and can be controlled by the vertical selection circuit VS. The selection transistor 106 (which typifies the selection transistors 106-1 and 106-2) exemplifies a switch for selecting a row, and can be controlled by the vertical selection circuit VS. The transfer transistor 102 (which typifies the transfer transistors 102-1, 102-2, 102-3, and 102-4) exemplifies a transfer element for transferring a charge generated by photoelectric conversion in the photodiode 101 to the conversion region 103, and can be controlled by the vertical selection circuit VS.

The reset transistor 104 can be controlled by means of a reset signal driven by the vertical selection circuit VS. The selection transistor 106 can be controlled by means of a row selection signal driven by the vertical selection circuit VS. The transfer transistor 102 can be controlled by means of a transfer signal driven by the vertical selection circuit VS. A set of the above-mentioned reset signal, row selection signal, and transfer signal are shown as a control signal r in FIG. 9.

An operation of outputting a signal from the pixel including the photodiode 101-1 to the first column readout line c1 will be representatively explained herein. A charge generated in the photodiode 101-1 is transferred to the conversion region 103-1 upon turning on the transfer transistor 102-1 by the vertical selection circuit VS. The charge transferred to the conversion region 103-1 is converted into a voltage in the conversion region 103-1 (to be more precise, the voltage of the conversion region 103-1 changes by V=Q/C, where Q is the transferred charge, and C is the capacitance of the conversion region 103-1). The amplification transistor 105-1 outputs a voltage which reflects the voltage of the conversion region 103-1 to the first column readout line c1 via the selection transistor 106-1 upon turning on the selection transistor 106-1 by the vertical selection circuit VS. Note that the first column readout line c1 is connected to a constant current source (not shown) and includes a source follower amplification circuit formed by the constant current source and the amplification transistor, and the amplification circuit can output a voltage which reflects the voltage of the conversion region 103-1. If a still image is output from the solid-state image sensor IS at a maximum resolution, signals can be output from individual pixels in the foregoing way.

In contrast, if a still image with a low resolution or a moving image (with a resolution lower than the above-mentioned maximum resolution) is output from the solid-state image sensor IS, signals from pixels of each subgroup in the same pixel column can be synthesized (added) by the conversion region, and the synthetic signal can be output from this region. An operation of outputting an image with a low resolution (still image or moving image) from the solid-state image sensor IS as in this case will be described. An operation of outputting a signal obtained by synthesizing signals from the pixel including the photodiode 101-1 and that including the photodiode 101-3 to the first column readout line c1 will be representatively explained herein. Charges generated in the photodiodes 101-1 and 101-3 are transferred to the conversion region 103-1 upon turning on the transfer transistors 102-1 and 102-3 by the vertical selection circuit VS. The charges transferred to the conversion region 103-1 are converted into a voltage in the conversion region 103-1. The voltage of the conversion region 103-1 changes by V=(Q1+Q3)/C, where Q1 is the charge transferred from the photodiode 101-1, Q3 is the charge transferred from the photodiode 101-3, and C is the capacitance of the conversion region 103-1. That is, signals from two pixels are synthesized (added) in the conversion region 103-1. The amplification transistor 105-1 outputs a voltage which reflects the voltage of the conversion region 103-1 to the first column readout line c1 via the selection transistor 106-1 upon turning on the selection transistor 106-1 by the vertical selection circuit VS.

Figure 2:
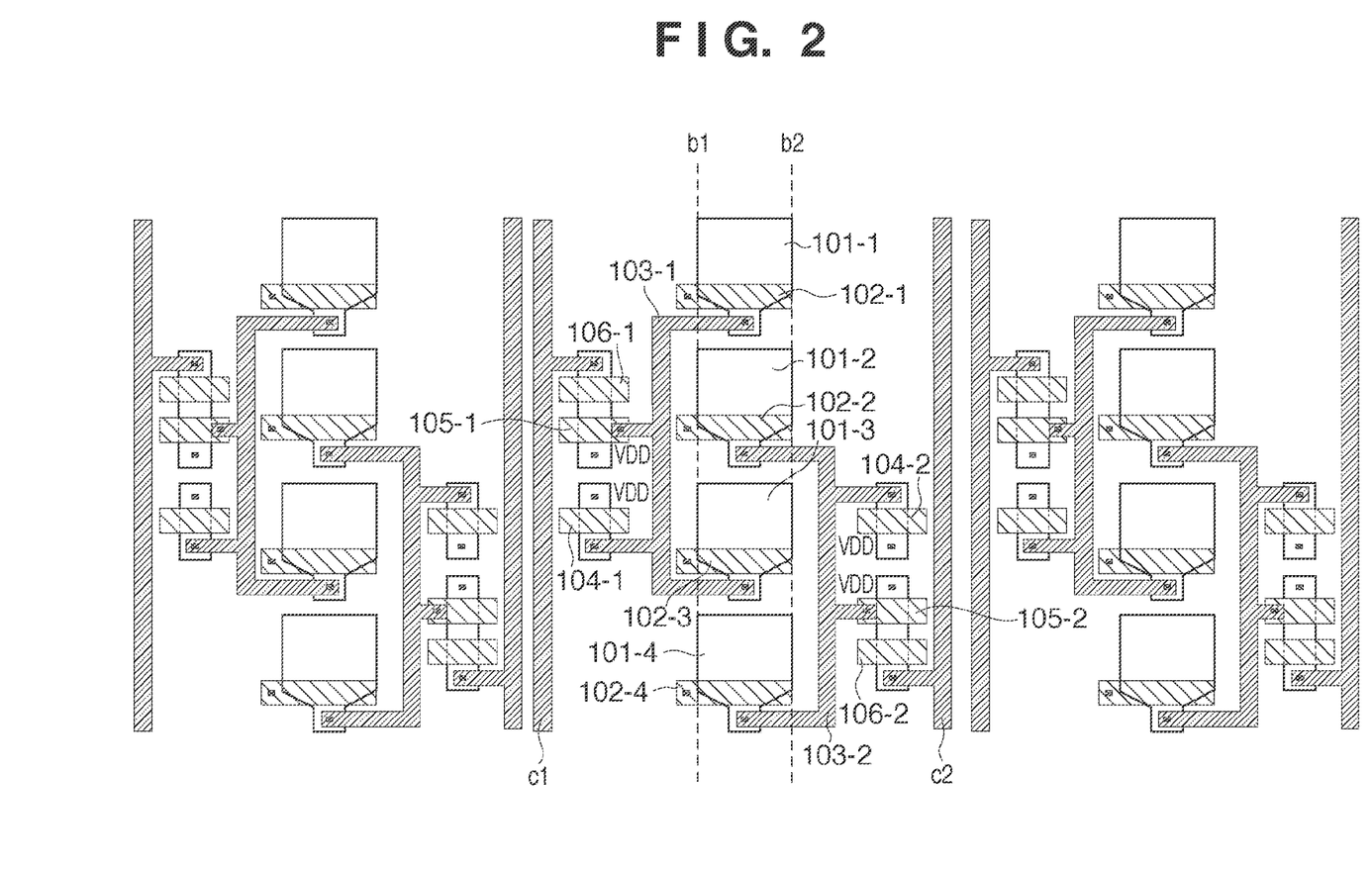
FIG. 2 is a plan layout diagram showing the first embodiment of the present invention.

FIG. 2 is a plan layout diagram showing two pixel columns in a pixel array, in which each pixel column has the circuitry shown in FIG. 1, according to the first embodiment of the present invention. Referring to FIG. 2, reference numerals 101-1, 101-2, 101-3, and 101-4 denote photodiodes (to be more precise, the surface layers of the photodiodes). Reference numerals 102-1, 102-2, 102-3, and 102-4 denote transfer transistors (to be more precise, the gate electrodes of the transfer transistors). Reference numerals 103-1 and 103-2 denote conversion regions. Each of the conversion regions 103-1 and 103-2 includes a diffusion region formed on a semiconductor substrate, a contact plug connected to the diffusion region, the conductive pattern of a first metal wiring layer connected to the contact plug, and a contact plug which connects the conductive pattern and the gate electrode of an amplification transistor to each other. Reference numerals 106-1 and 106-2 denote selection transistors (to be more precise, the gate electrodes of the selection transistors). Reference numerals 105-1 and 105-2 denote amplification transistors (to be more precise, the gate electrodes of the amplification transistors), and share active layers with the selection transistors 106-1 and 106-2, respectively. Reference numerals 104-1 and 104-2 denote reset transistors (to be more precise, the gate electrodes of the reset transistors). A first column readout line c1 and a second column readout line c2 can be arranged in the same layer.

In the first embodiment illustrated in FIG. 2, the photodiodes 101-1 to 101-4 of respective pixels in a pixel array are arranged between the first column readout line c1 and second column readout line c2 provided in the pixel array. The conversion region 103-1 of a subgroup, to which pixels belonging to the pixel rows (first and third pixel rows) of the first group belong, is arranged between the first column readout line c1 and a boundary line b2, on the side of the second column readout line c2, of the photodiodes 101-1 and 101-3 of the pixels. Also, the conversion region 103-2 of a subgroup, to which pixels belonging to the pixel rows (second and fourth pixel rows) of the second group belong, is arranged between the second column readout line c2 and a boundary line b1, on the side of the first column readout line c1, of the photodiodes 101-2 and 101-4 of the pixels. This arrangement can reduce capacitive coupling between the conversion regions 103-1 and 103-2 without their intersection. In contrast, an arrangement in which the conversion regions 103-1 and 103-2 intersect with each other generates a large amount of capacitive coupling (and, consequently, crosstalk) between them. This means that crosstalk occurs between signals from pixels of different colors, thus leading to color mixing.

In the first embodiment illustrated in FIG. 2, because photodiodes of pixels in even rows have the same shape as those of pixels in odd rows, the difference in photoelectric conversion characteristic is small between even rows and odd rows.

Figure 3:
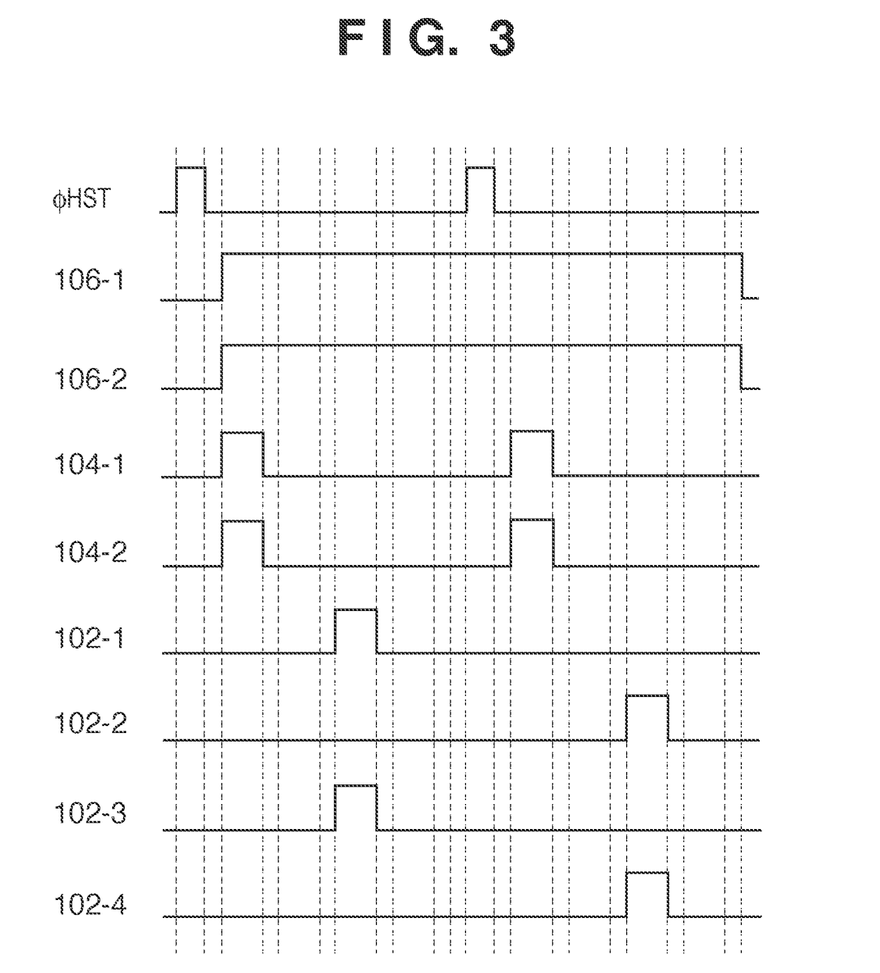
FIG. 3 is a timing chart illustrating an operation of synthesizing signals from two pixels in the same pixel column, and reading the synthetic signal.

FIG. 3 is a timing chart illustrating an operation of synthesizing signals from two pixels in the same pixel column, and reading the synthetic signal. Referring to FIG. 3, reference symbol φHST denotes a row selection pulse; and other symbols, pulses generated by the transistors shown in FIGS. 1 and 2. The time period from when one pulse φHST is input until the next pulse φHST is input is one horizontal scanning time period. In a horizontal scanning time period, first, the reset transistors 104-1 and 104-2 and the selection transistors 106-1 and 106-2 are turned on to reset the voltages of the conversion regions 103-1 and 103-2, respectively. At this time, reset signals are supplied to the column readout lines c1 and c2, and read by a circuit (not shown). Next, the transfer transistors 102-1 and 102-3 are turned on. With this operation, charges in the photodiodes 101-1 and 101-3 are transferred to the conversion region 103-1. An optical signal is read by a circuit (not shown) upon turning off the transfer transistors 102-1 and 102-3. In the next horizontal scanning time period, the voltages of the conversion regions 103-1 and 103-2 are reset again, and optical signals in even rows are then read upon turning on the transfer transistors 102-2 and 102-4 next. Signals over the entire field are read by repeating the above-mentioned operation for four rows. Note that the pixel driving timing within one horizontal scanning time period is the same in the first and third pixel rows but need not exactly be the same as long as the two pixels can be driven in the same horizontal scanning time period.

Figure 4:
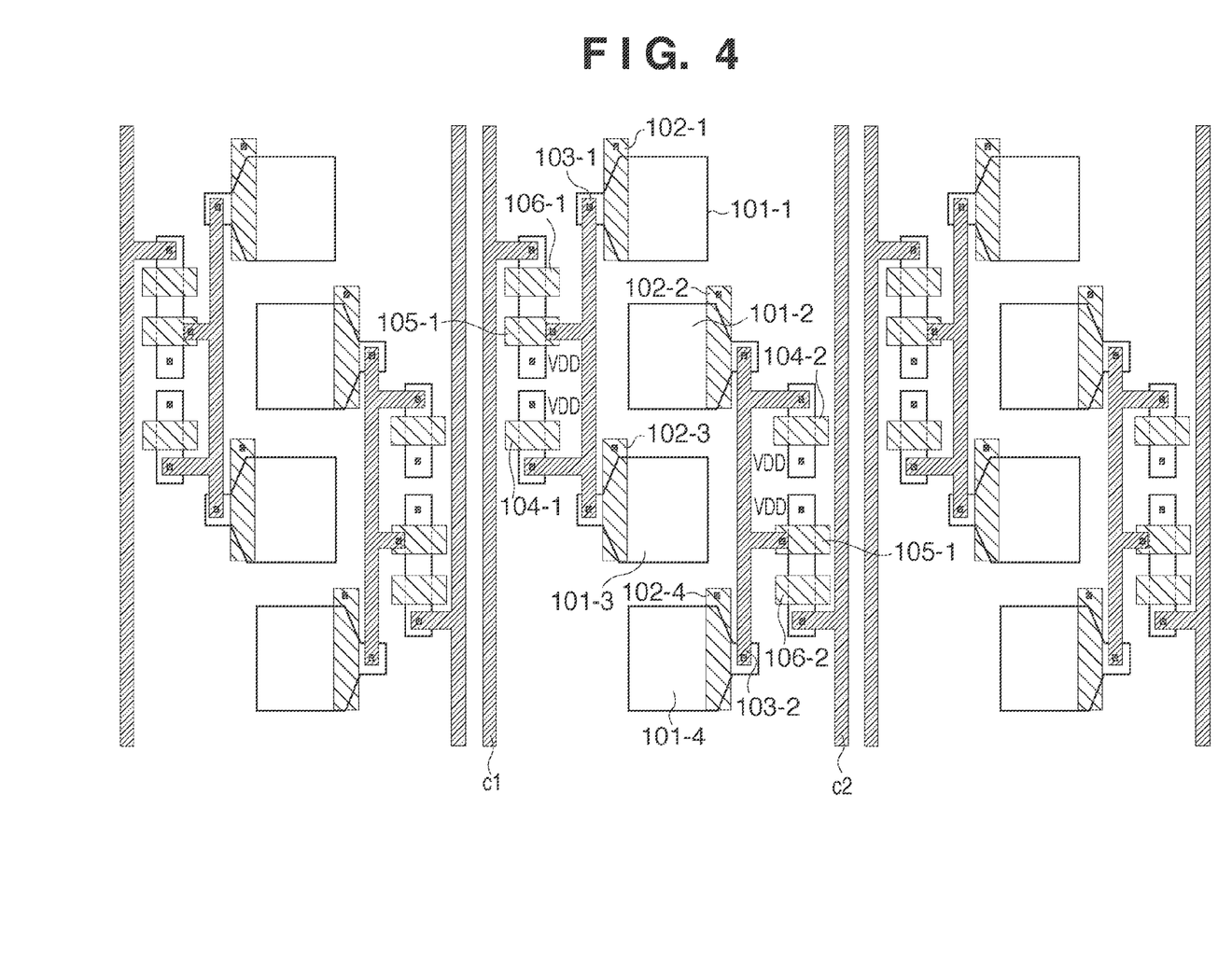
FIG. 4 is a plan layout diagram showing a modification to the first embodiment of the present invention.

FIG. 4 shows a modification of the plan layout shown in FIG. 2. In the modification to the first embodiment illustrated in FIG. 4, photodiodes 101-1 to 101-4 of respective pixels in a pixel array are arranged between a first column readout line c1 and second column readout line c2 provided in the pixel array. A conversion region 103-1 of a subgroup, to which pixels belonging to the pixel rows (first and third pixel rows) of the first group belong, is arranged between the first column readout line c1 and the photodiodes 101-1 and 101-3 of the pixels. Also, a conversion region 103-2 of a subgroup, to which pixels belonging to the pixel rows (second and fourth pixel rows) of the second group belong, is arranged between a second column readout line c2 and the photodiodes 101-2 and 101-4 of the pixels. This arrangement can reduce capacitive coupling between the conversion regions 103-1 and 103-2 without their intersection. The distance between the conversion regions 103-1 and 103-2 can be larger in this modification than in the embodiment shown in FIG. 2. Hence, the amount of capacitive coupling between the conversion regions 103-1 and 103-2 can be smaller in this modification than in the embodiment shown in FIG. 2.

Moreover, according to the embodiments shown in FIGS. 2 and 4, since two column signal lines are provided to one pixel column, signals can be simultaneously read from a pixel in a pixel row of the first group and that in a pixel row of the second group. In an operation of synthesizing signals from two pixels in the same pixel column, and reading the synthetic signal, signals can be simultaneously read from pixels in pixel rows of the first group and those in pixel rows of the second group by simultaneously turning on the transfer transistors 102-1 to 102-4.

The opening areas of pixels may reduce upon arranging two column readout lines for one pixel column. Such a side effect can be lessened by optimizing the shapes of microlenses placed on the photodiodes 101, and the layouts of the reset transistors 104, amplification transistors 105, and selection transistors 106.

Figure 5:
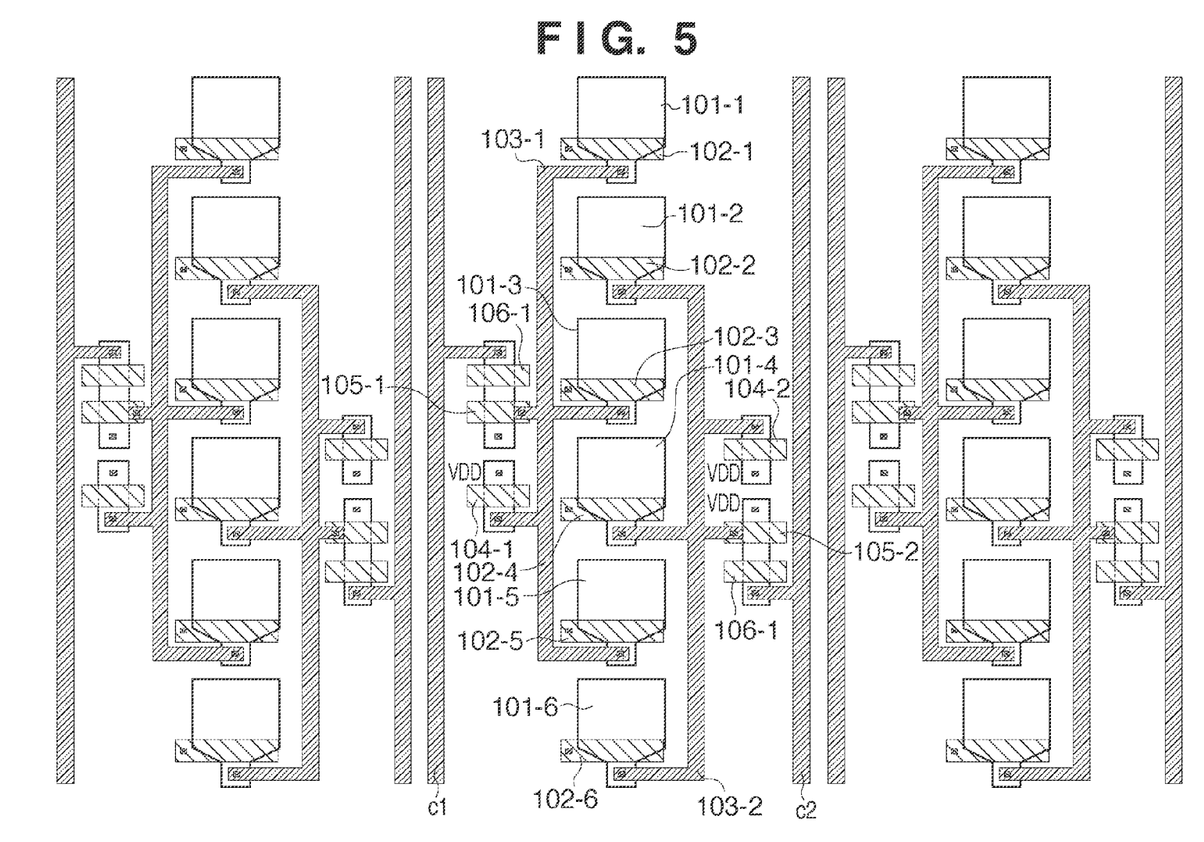
FIG. 5 is a plan layout diagram showing the second embodiment of the present invention.

FIG. 5 is a plan layout diagram showing the second embodiment of the present invention. The second embodiment is a modification to the first embodiment illustrated in FIG. 2. Although a method of arranging conversion regions can be the same as in the first embodiment illustrated in FIG. 2, it may be as illustrated in FIG. 4. In the second embodiment, a conversion region is shared by three pixels of the same color in the same pixel column in a Bayer arrangement. More specifically, a conversion region 103-1 is shared by photodiodes 101-1, 101-3, and 101-5 of pixels of a first group (odd rows). Also, a conversion region 103-2 is shared by photodiodes 101-2, 101-4, and 101-6 of pixels of a second group (even rows). The second embodiment is the same as the first embodiment except that in the former one conversion region is shared among three pixels.

FIG. 6 is a plan layout diagram showing the third embodiment of the present invention. The third embodiment is a modification to the first and second embodiments illustrated in FIGS. 2 and 5, respectively. In the third embodiment, a conversion region is shared by five pixels of the same color in the same pixel column in a Bayer arrangement. A method of arranging conversion regions is the same as in the first and second embodiments. A conversion region 103-1 is shared by photodiodes 101-1, 101-3, 101-5, 101-7, and 101-9 of pixels of a first group (odd rows). Also, a conversion region 103-2 is shared by photodiodes 101-2, 101-4, 101-6, 101-8, and 101-10 of pixels of a second group (even rows). The third embodiment is the same as the first embodiment except that in the former one conversion region is shared among five pixels.

Figure 7:
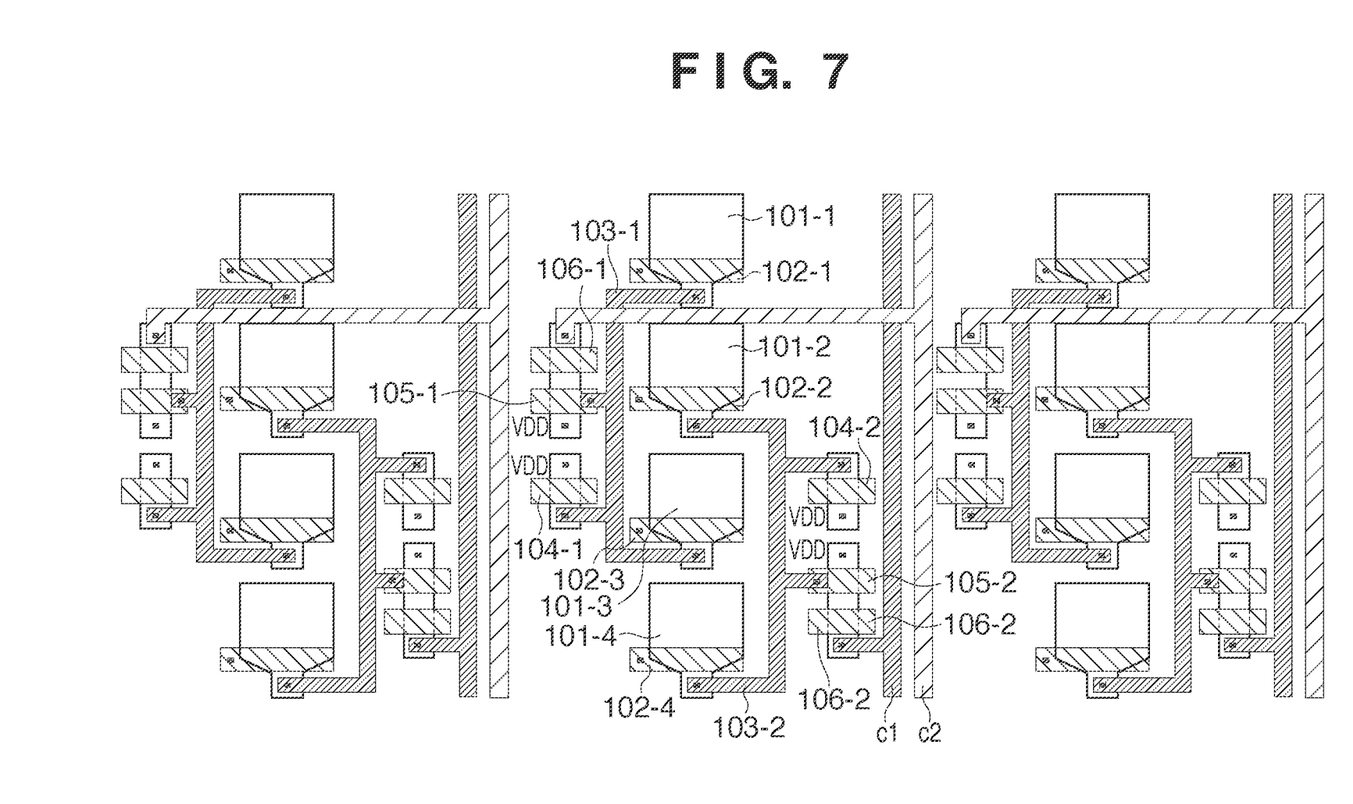
FIG. 7 is a plan layout diagram showing the fourth embodiment of the present invention.

FIG. 7 is a plan layout diagram showing the fourth embodiment of the present invention. The fourth embodiment illustrated in FIG. 7 is different from the first to third embodiments in that in the former two column readout lines (i.e., a first column readout line c1 and a second column readout line c2) for a given pixel column are arranged between photoelectric conversion elements in the given pixel column and those in a pixel column adjacent to it. The first column readout line c1 and second column readout line c2 are arranged in different layers. Even in such an arrangement, conversion regions 103-1 and 103-2 can be arranged without their intersection, as in the first to third embodiments. Moreover, the first column readout line c1 and second column readout line c2 can be arranged to overlap each other in the plan layout by arranging them in different layers. In this case, the opening areas of photodiodes can be widened, thus improving the sensitivity.

Figure 8:
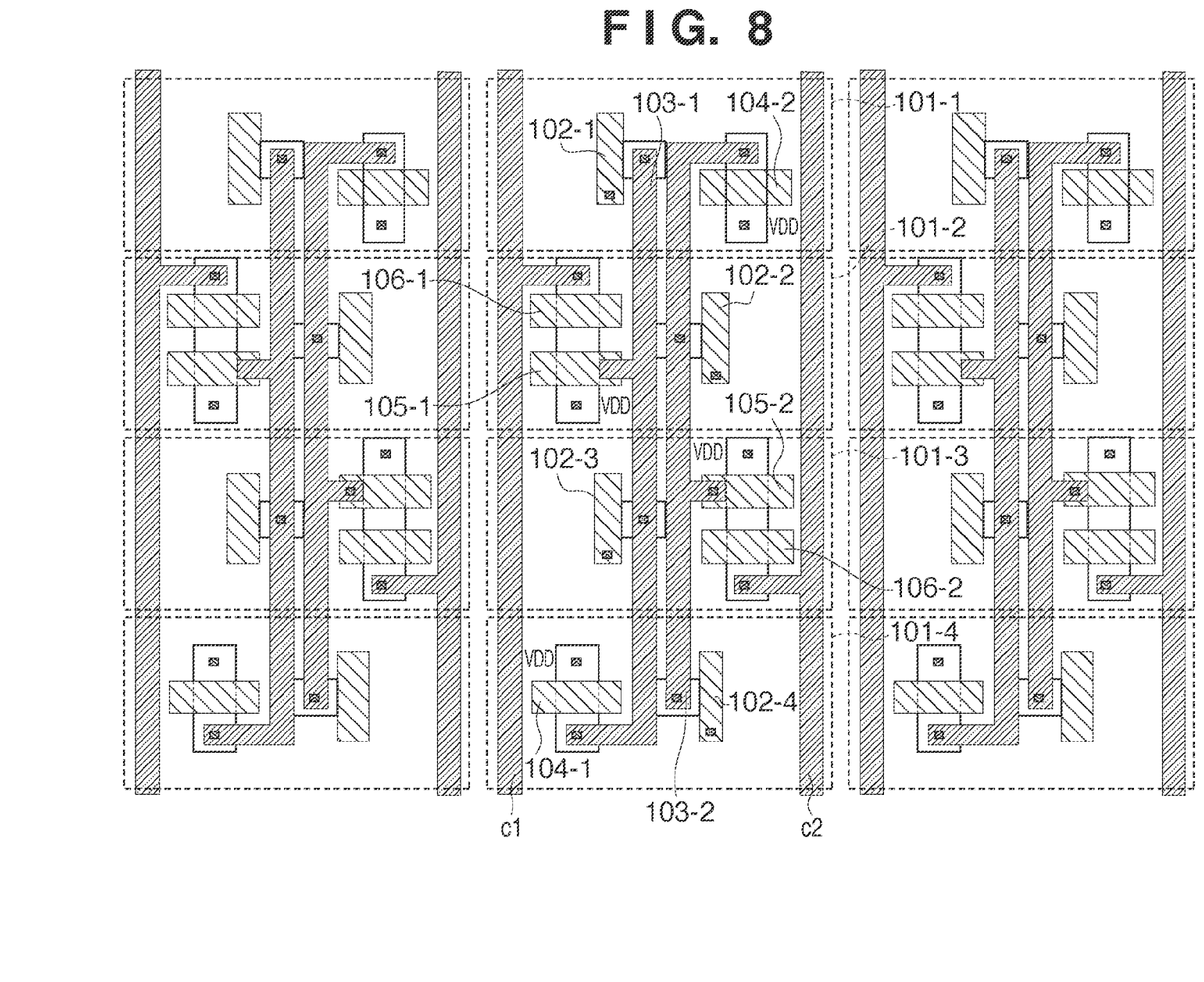
FIG. 8 is a plan layout diagram showing the fifth embodiment of the present invention.

FIG. 8 is a plan layout diagram showing the fifth embodiment of the present invention. A solid-state image sensor according to the fifth embodiment is a back-side illumination solid-state image sensor in which photodiodes 101-1 to 101-4 indicated by dotted lines are arranged on the back surface of a semiconductor substrate such as a silicon wafer. In the back-side illumination solid-state image sensor, the opening ratios of pixels are not decreased by two column readout lines provided to one pixel column. Also, the driving force can be improved by setting the gate widths of transistors wide. Moreover, since the gate areas of amplification transistors can be set large, RTS (Random Telegraph Noise) can be reduced. Even the back-side illumination solid-state image sensor can prevent crosstalk and rapidly obtain an output with a high S/N ratio.

Figure 10:
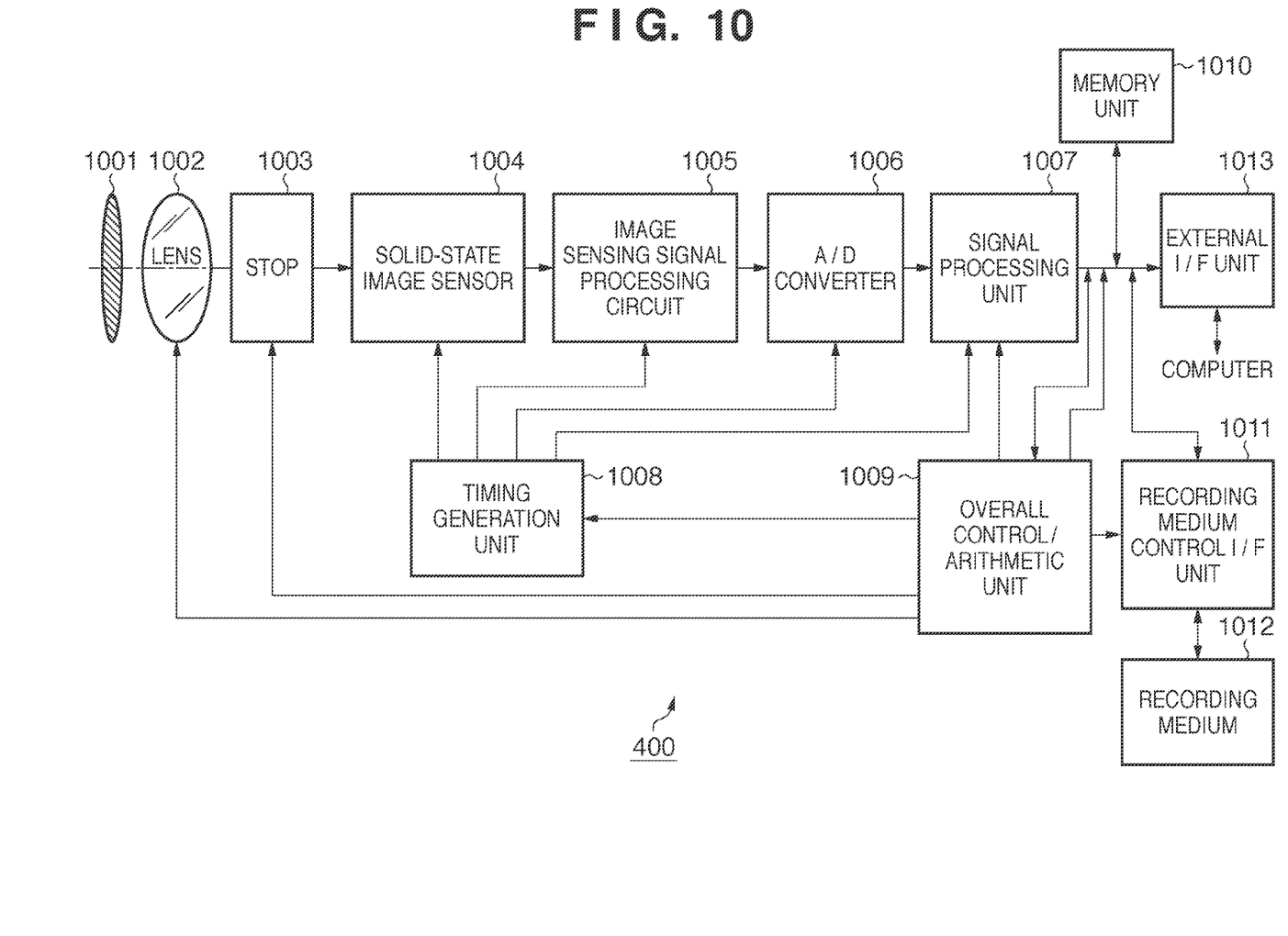
FIG. 10 is a block diagram showing the schematic configuration of an image sensing apparatus (camera) according to an embodiment of the present invention.

FIG. 10 is a block diagram showing the schematic configuration of an image sensing apparatus (camera) according to an embodiment of the present invention. An image sensing apparatus 400 includes a solid-state image sensor 1004 typified by the solid-state image sensor IS according to each of the first to fourth embodiments. An optical image of an object is formed on the image sensing surface of the solid-state image sensor 1004 by a lens 1002. A barrier 1001 which serves both as a protector of the lens 1002 and a main switch can be provided outside the lens 1002. A stop 1003 for adjusting the amount of light emerging from the lens 1002 can be provided to the lens 1002. Image sensing signals output via a plurality of channels from the solid-state image sensor 1004 undergo processes such as various types of correction and clamping by an image sensing signal processing circuit 1005. The image sensing signals output via the plurality of channels from the image sensing signal processing circuit 1005 are analog-to-digital-converted by an A/D converter 1006. The image data output from the A/D converter 1006 undergoes, for example, various types of correction and data compression by a signal processing unit 1007. The solid-state image sensor 1004, image sensing signal processing circuit 1005, A/D converter 1006, and signal processing unit 1007 operate in accordance with timing signals generated by a timing generation unit 1008.

The blocks 1005 to 1008 may be formed on a chip on which the solid-state image sensor 1004 is formed. Each block of the image sensing apparatus 400 is controlled by an overall control/arithmetic unit 1009. The image sensing apparatus 400 also includes a memory unit 1010 for temporarily storing image data, and a recording medium control interface unit 1011 for recording or reading out an image on or to a recording medium. A recording medium 1012 includes, for example, a semiconductor memory and is detachable. The image sensing apparatus 400 may include an external interface (I/F) unit 1013 for communication with, for example, an external computer.

The operation of the image sensing apparatus (camera) 400 shown in FIG. 10 will be described next. In response to opening of the barrier 1001, a main power supply, a power supply for a control system, and a power supply for image sensing system circuits such as the A/D converter 1006 are sequentially turned on. After that, to control the exposure value, the overall control/arithmetic unit 1009 opens the stop 1003. A signal output from the solid-state image sensor 1004 is provided to the A/D converter 1006 through the image sensing signal processing circuit 1005. The A/D converter 1006 A/D-converts the signal, and outputs the converted data to the signal processing unit 1007. The signal processing unit 1007 processes the data and provides the processed data to the overall control/arithmetic unit 1009. The overall control/arithmetic unit 1009 performs an arithmetic operation for determining the exposure value. The overall control/arithmetic unit 1009 controls the stop 1003 based on the determined exposure value.

The overall control/arithmetic unit 1009 extracts high-frequency components from the signal which is output from the solid-state image sensor 1004 typified in the above-described first to fourth embodiments and is processed by the signal processing unit 1007, and calculates the distance to the object based on the high-frequency components. After that, the lens 1002 is driven to determine whether an in-focus state is obtained. If it is determined that an in-focus state is not obtained, the lens 1002 is driven and the distance is calculated again.

After an in-focus state is confirmed, final exposure starts. After the exposure is completed, the image sensing signal output from the solid-state image sensor 1004 undergoes, for example, correction by the image sensing signal processing circuit 1005, is A/D-converted by the A/D converter 1006, and is processed by the signal processing unit 1007. The image data processed by the signal processing unit 1007 is stored in the memory unit 1010 by the overall control/arithmetic unit 1009.

After that, the image data stored in the memory unit 1010 is recorded on the recording medium 1012 via the recording medium control I/F unit 1011 under the control of the overall control/arithmetic unit 1009. Also, the image data can be provided to, for example, a computer via the external I/F unit 1013, and processed by it.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-232866, filed Oct. 6, 2009, which is hereby incorporated by reference herein in its entirety.

What is claimed is:

1. A solid-state image sensor including a pixel array in which a plurality of pixels are two-dimensionally arranged so as to form a plurality of pixel rows and a plurality of pixel columns, and color filters arranged on the pixel array such that signals of colors corresponding to a color arrangement of the color filters are output from the plurality of pixels, wherein a first column readout line and a second column readout line are provided to each pixel column, the plurality of pixel rows of the pixel array are divided into pixel rows of a first group and pixel rows of a second group, the first group is divided into subgroups each formed from pixels of an identical color, the second group is divided into subgroups each formed from pixels of an identical color, signals from pixels belonging to the pixel rows of the first group are output to the first column readout line, and signals from pixels belonging to the pixel rows of the second group are output to the second column readout line, pixels belonging to at least one of the subgroups of the first group and pixels belonging to at least one of the subgroups of the second group being alternately arranged, each pixel includes a photoelectric conversion element and a transfer element, signals of pixels belonging to each subgroup of the first group are output to the first column readout line by a first amplification element arranged between the first column readout line and the photoelectric conversion elements of the pixels belonging to the subgroup of the first group, and signals of pixels belonging to each subgroup of the second group are output to the second column readout line by a second amplification element arranged between the second column readout line and the photoelectric conversion elements of the pixels belonging to the subgroup of the second group, pixels belonging to a same subgroup in a same pixel column share a conversion region, the conversion region including (i) floating diffusion regions, each of the floating diffusion regions being provided to a respective one of the pixels belonging to the same subgroup in the same pixel column and sharing the conversion region, and each of the floating diffusion regions being arranged between the photoelectric conversion element of the pixel belonging to the first group in the same pixel column and the photoelectric conversion element of the pixel belonging to the second group in the same pixel column, and (ii) an electrically conductive member connecting the floating diffusion regions, wherein charges generated in each of the photoelectric conversion elements of the pixels belonging to the same subgroup in the same pixel column and sharing the conversion region are transferred to a corresponding floating diffusion region of the shared conversion region by the transfer elements, the charges transferred to the floating diffusion regions are converted into a voltage in the shared conversion region, the electrically conductive member of the pixels belonging to each subgroup of the first group includes portions extending from the floating diffusion regions toward the first column readout line, and a portion extending along the first column readout line so as to connect the portions extending from the floating diffusion regions toward the first column readout line and the first amplification element, the electrically conductive member of the pixels belonging to each subgroup of the second group includes portions extending from the floating diffusion regions toward the second column readout line, and a portion extending along the second column readout line so as to connect the portions extending from the floating diffusion regions toward the second column readout line and the second amplification element, and a given conversion region does not intersect any other conversion regions included in a pixel column of the given conversion region.

2. The sensor according to claim 1, wherein the photoelectric conversion element of each pixel in a pixel column is arranged between the first column readout line and the second column readout line provided to the pixel column, the conversion region of a subgroup, to which pixels belonging to the pixel rows of the first group belong, is arranged between the first column readout line and a boundary line, on a side of the second column readout line, of the photoelectric conversion elements of the pixels, and the conversion region of a subgroup, to which pixels belonging to the pixel rows of the second group belong, is arranged between the second column readout line and a boundary line, on a side of the first column readout line, of the photoelectric conversion elements of the pixels.

3. The sensor according to claim 1, wherein the first column readout line and the second column readout line are arranged in an identical layer.

4. The sensor according to claim 1, wherein the pixel rows of the first group and the pixel rows of the second group are arranged alternately.

5. The sensor according to claim 1, wherein the sensor is incorporated into an image sensing apparatus comprising:
   a signal processing unit configured to process a signal obtained by the sensor.

6. The sensor according to claim 1, wherein signals are simultaneously output to the first column readout line and the second column readout line that are provided to an identical pixel column.

7. The sensor according to claim 1, wherein the color filters are arranged in accordance with a Bayer arrangement.

8. The sensor according to claim 1, wherein the sensor is incorporated into an image sensing apparatus comprising:
   a signal processor configured to process a signal output from the sensor.

9. A solid-state image sensor comprising a plurality of pixel columns, each of the plurality of pixel columns including:
   first and second photoelectric conversion elements for which color filters of a first color are assigned;
   third and fourth photoelectric conversion elements for which color filters of a second color are assigned, the second color being different from the first color, wherein the third photoelectric conversion element is arranged between the first and second photoelectric conversion elements, and the second photoelectric conversion element is arranged between the third and fourth photoelectric conversion elements;
   a first conversion region including a first floating diffusion region arranged between the first photoelectric conversion element and the third photoelectric conversion element, a second floating diffusion region arranged between the second photoelectric conversion element and the fourth photoelectric conversion element, and a first electrically conductive member connecting the first and second floating diffusion regions;
   a first transfer element that transfers charges from the first photoelectric conversion element to the first floating diffusion region;
   a second transfer element that transfers charges from the second photoelectric conversion element to the second floating diffusion region;
   a second conversion region including a third floating diffusion region arranged between the third photoelectric conversion element and the second photoelectric conversion element, a fourth floating diffusion region arranged such that the fourth photoelectric conversion element is sandwiched by fourth floating diffusion region and the second floating diffusion region, and second electrically conductive member connecting the third and fourth floating diffusion regions;
   a third transfer element that transfers charges from the third photoelectric conversion element to the third floating diffusion region;
   a fourth transfer element that transfers charges from the fourth photoelectric conversion element to the fourth floating diffusion region;
   a first column readout line;
   a second column readout line;
   a first amplification element that is arranged between the first column readout line and a pixel column including the first, second, third and fourth photoelectric conversion elements and that amplifies a signal of the first conversion region and outputs the signal to the first column readout line;
   a second amplification element that is arranged between the second column readout line and the pixel column including the first, second, third and fourth photoelectric conversion elements and that amplifies a signal of the second conversion region and outputs the signal to the second column readout line,
   wherein the first electrically conductive member includes portions extending from the first and second floating diffusion regions toward the first column readout line, and a portion extending along the first column readout line so as to connect the portions extending from the first and second floating diffusion regions toward the first column readout line and the first amplification element,
   wherein the second electrically conductive member includes portions extending from the third and fourth floating diffusion regions toward the first column readout line, and a portion extending along the second column readout line so as to connect the portions extending from the third and fourth floating diffusion regions toward the first column readout line and the second amplification element, and
   wherein the first conversion region does not intersect the second conversion region.

10. The sensor according to claim 9, wherein
   the first to fourth photoelectric conversion elements of each pixel column are arranged between the first column readout line and the second column readout line for the pixel column,
   the first floating diffusion region is arranged between the first column readout line and a boundary line, on a side of a second column line, of the first photoelectric conversion element, and
   the third floating diffusion region is arranged between the second column readout line and a boundary line, on a side of a first column line, of the third photoelectric conversion element.

11. The sensor according to claim 10, wherein
   the second floating diffusion is arranged between the first column readout line and a boundary line, on a side of the second column line, of the second photoelectric conversion element, and
   the fourth floating diffusion is arranged between the second column readout line and a boundary line, on a side of the first column line, of the fourth photoelectric conversion element.

12. The sensor according to claim 9, wherein the first column readout line and the second column readout line are arranged in an identical layer.

13. The sensor according to claim 9, wherein the first and third photoelectric conversion elements simultaneously transfer charges to the first and second conversion regions, respectively.

14. The sensor according to claim 9, wherein the first conversion region adds charges of the first photoelectric conversion element and charges of the second photoelectric conversion element.

15. The sensor according to claim 9, wherein signals are simultaneously output to the first column readout line and the second column readout line which are provided to an identical pixel column.

16. The sensor according to claim 9, wherein the color filters are arranged in accordance with a Bayer arrangement.

17. The sensor according to claim 9, wherein the sensor is incorporated into an image sensing apparatus comprising:
   a signal processor configured to process a signal output from the sensor.

* * * * *